(12) United States Patent
Payne (10) Patent No.: US 9,317,253 B1
(45) Date of Patent: Apr. 19, 2016

(54) SHIFT REGISTER HAVING MULTIPLE PROCESSING STAGES

(71) Applicant: Xilinx, Inc., San Jose, CA (US)

(72) Inventor: Robert E. Payne, Edinburgh (GB)

(73) Assignee: XILNIX, INC., San Jose, CA (US)

( * ) Notice: Subject to any disclaimer, the term of this patent is extended or adjusted under 35 U.S.C. 154(b) by 627 days.

(21) Appl. No.: 13/650,588

(22) Filed: Oct. 12, 2012

(51) Int. Cl.
*G06F 7/72* (2006.01)
*H03M 13/15* (2006.01)

(52) U.S. Cl.
CPC .............. *G06F 7/724* (2013.01); *H03M 13/15* (2013.01)

(58) Field of Classification Search
None
See application file for complete search history.

(56) References Cited

U.S. PATENT DOCUMENTS

| | | | |
|---|---|---|---|
| 4,797,848 A * | 1/1989 | Walby | 708/492 |
| 5,745,522 A * | 4/1998 | Heegard | 380/46 |
| 2006/0090119 A1* | 4/2006 | Dong et al. | 714/784 |
| 2010/0299579 A1* | 11/2010 | Lablans | H03M 13/3983 714/781 |

* cited by examiner

*Primary Examiner* — Michael D Yaary
(74) *Attorney, Agent, or Firm* — LeRoy D. Maunu; Jonathan Soike (57) ABSTRACT

In one embodiment, a shift register is provided. The LFSR includes a plurality of processing stages coupled in series, each configured to implement N taps of the LFSR. N single-tap circuits are coupled together in series and arranged to implement the last N taps of the LFSR. Each coefficient(s) of a feedback polynomial of the LFSR is implemented by one of the taps of the plurality of processing stages or the N single-tap circuits. A feedback generation circuit is configured to provide, for each of the plurality of processing stages, a respective feedback signal as a function of polynomial coefficients implemented by the processing stage and output from one or more of the N single tap circuits.

20 Claims, 8 Drawing Sheets

FIG. 9

SHIFT REGISTER HAVING MULTIPLE PROCESSING STAGES

FIELD OF THE INVENTION

The disclosure generally relates to encoding data blocks.

BACKGROUND

A linear feedback shift register (LFSR) is a shift register whose input bit is a linear function of its previous state. LFSRs are commonly used in a number of different applications including generating pseudo-random noise sequences, cyclic redundancy checks (CRC), forward error-correction (FEC), cryptography, etc. The LFSR divides an input sequence by a polynomial implemented by the LFSR. An LFSR generally includes a shift register of one-bit memory elements and logic that performs a logical exclusive-or (XOR) of some bits of the overall shift register value with bits in a feedback path. The bit positions of the LFSR used in the XOR circuitry are referred to as taps. Taps may or may not affect the next value of the LFSR depending on respective coefficients of the polynomial implemented by the LFSR.

Two common LFSR architectures are the Fibonacci LFSR and the Galois LFSR. In the Fibonacci LFSR, values of the bits in the LFSR are filtered according to the respective coefficients of the polynomial and the filtered values are XOR'd together to provide an output. The result is also XOR'd with an input data value and shifted back into an input of the LFSR as feedback. In the Galois approach, the LFSR does not concatenate every tap to produce the feedback. Rather, an output value is filtered for each tap, according to the respective coefficient, and XOR'd with data as it is shifted between registers of the LFSR.

An LFSR can be implemented in either programmable logic or ASIC technologies. However, the Fibonacci and Galois LFSRs may utilize a large number of resources, which are generally limited for both ASICs and programmable integrated circuits (ICs).

SUMMARY

In one embodiment, a shift register (e.g., a linear feedback shift register (LFSR)) is provided. The LFSR includes a plurality of processing stages coupled in series. Each processing stage is configured to implement N taps of the LFSR, where N>1. The LFSR also includes N single-tap circuits coupled together in series. A first of the N single tap circuits in the series is coupled to an output of a last of the series of processing stages. The N single tap circuits are configured to implement the last N taps of the LFSR. Each coefficient(s) of a feedback polynomial of the LFSR is implemented by one of the taps of the plurality of processing stages or the N single-tap circuits. A feedback generation circuit is configured to provide, for each of the plurality of processing stages, a respective feedback signal as a function of polynomial coefficients implemented by the processing stage and output from one or more of the N single tap circuits.

In another embodiment, a forward error correction (FEC) circuit is provided. The FEC circuit includes, a linear feedback shift register (LFSR) configured to divide an input sequence of symbols by a minimum polynomial to determine a set of remainders. A syndrome calculation circuit is configured to calculate a syndrome for each of the determined set of remainders. The LFSR includes a plurality of processing stages coupled in series. Each processing stage is configured to implement N taps of the LFSR, where N>1. The LFSR also includes N single-tap circuits coupled in series. A first of the N single tap circuits in the series is coupled to an output of a last of the series of processing stages. The N single tap circuits are configured to implement the last N taps of the LFSR. Each coefficient(s) of a feedback polynomial of the LFSR is implemented by one of the taps of the plurality of processing stages or the N single-tap circuits. A feedback generation circuit is configured to provide, for each of the plurality of processing stages, a respective feedback signal as a function of polynomial coefficients implemented by the processing stage and output from one or more of the N single tap circuits.

In yet another embodiment, a method is provided for generation of a circuit design specification of a linear feedback shift register (LFSR). A code generation polynomial (G(x)) having L coefficients ($0 \leq i < L$) is input along with a design parameter N. In response to the input code polynomial, an HDL circuit design specification of an LFSR for the code generation polynomial is generated. The generated HDL circuit design specification is stored in a computer readable medium. The LFSR includes a plurality of processing stages coupled in series. Each processing stage is configured to implement N taps of the LFSR. The first L-N of the coefficients of the polynomial G(x) correspond to respective ones of the taps implemented by the plurality of processing stages. The LFSR also includes N single tap circuits coupled in series. A first of the N single tap circuits in the series is coupled to an output of a last of the series of processing stages. Each of the last N of the coefficients of the polynomial G(x) correspond to a respective one of the N single tap circuits. The LFSR further includes a feedback generation circuit configured to provide, for each of the plurality of processing stages, a respective feedback signal as a function of coefficients implemented by the processing stage and N values input to the N single tap circuits.

Other embodiments will be recognized from consideration of the Detailed Description and Claims, which follow.

BRIEF DESCRIPTION OF THE DRAWINGS

Various aspects and advantages of the disclosed embodiments will become apparent upon review of the following detailed description and upon reference to the drawings in which.

DETAILED DESCRIPTION OF THE DRAWINGS

LFSR circuits are disclosed that require fewer hardware resources in comparison to the other Fibonacci and Galois LFSR circuits. The LFSR circuits may provide a significant reduction in required resources over previous approaches when the LFSR is implemented using programmable resources of a programmable IC. One of the disclosed LFSR circuits has a plurality of processing stages. Each stage is configured to efficiently implement multiple taps of the LFSR with fewer hardware resources than prior LFSR circuits would use to implement the same number of taps. In comparison to the Fibonacci and Galois LFSRs, which include a separate XOR circuit (e.g., a look-up table (LUT)) for each tap of the LFSR, each of the processing stages in the disclosed LFSR implements multiple taps using a single XOR operation.

Figure 1:
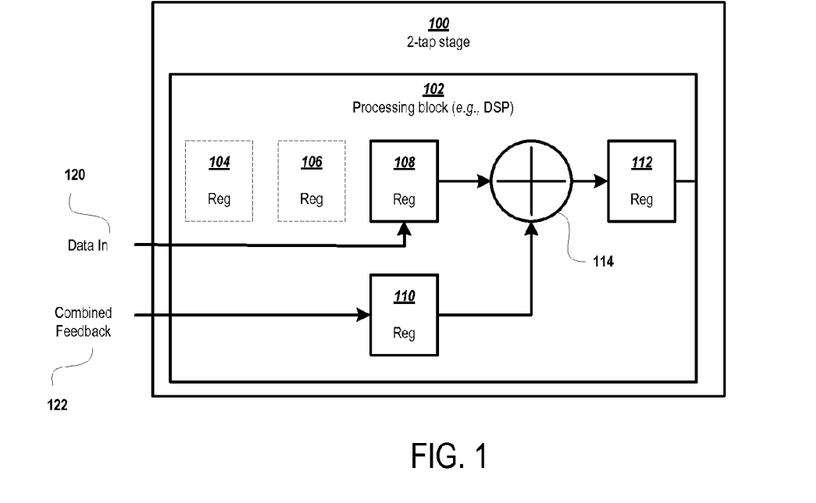
FIG. 1 shows a configuration of a processing block to implement a 2-tap LFSR stage.
Figure 2:
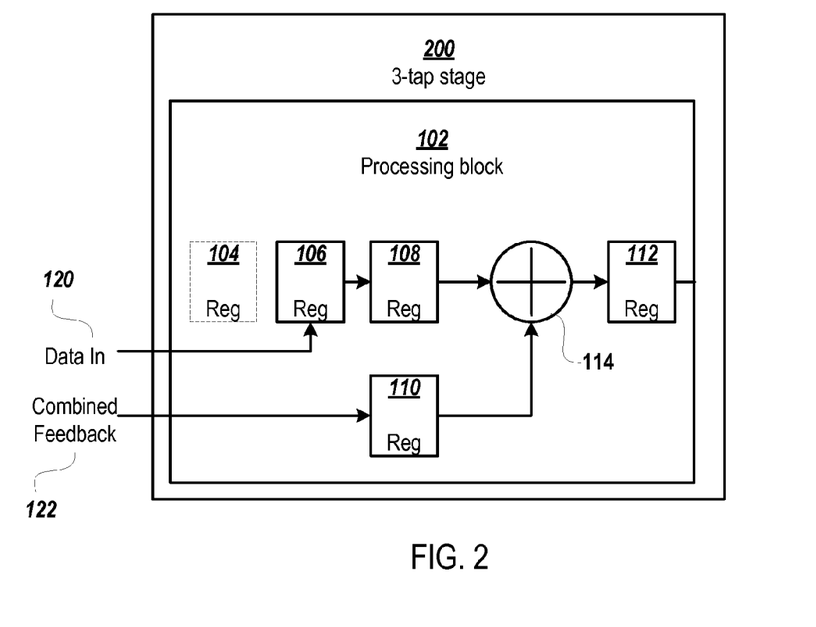
FIG. 2 shows a configuration of a processing block to implement a 3-tap LFSR stage.
Figure 3:
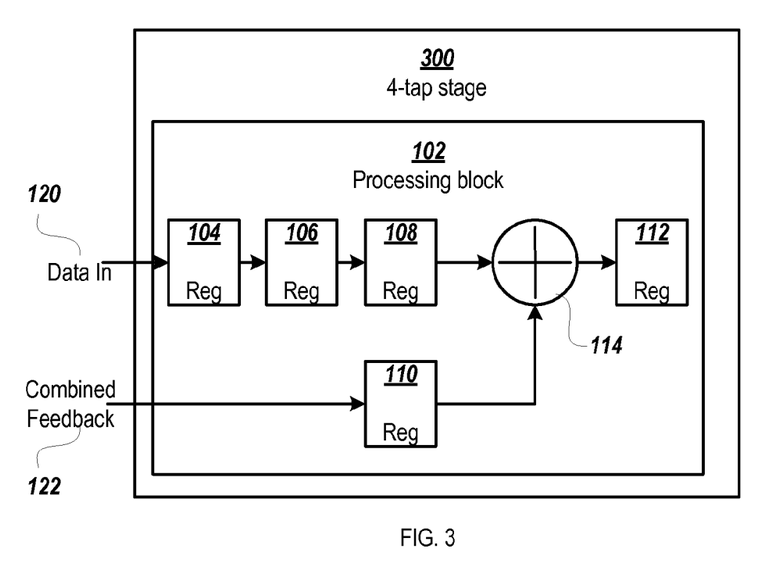
FIG. 3 shows a configuration of a processing block to implement a 4-tap LFSR stage.

FIGS. 1 through 3 show different configurations of a processing block 102 that implement multi-tap processing stages. The processing block 102 may be a digital signal processor (DSP) or a configurable processor block in a field programmable gate array (FPGA). The processing block 102 in this example includes five registers (104, 106, 108, 110, and 112) and a logic processor 114, which is programmable to perform an XOR operation. In FIGS. 1 through 3, the registers (104, 106, 108, 110, and 112) are shown as solid lines if the registers are utilized to form the multi-tap stage. Otherwise, the registers are shown by dashed lines. In each of FIGS. 1-3, the processing block is configured to implement two or more taps of an LFSR. As described above, the typical Galois implementation has XOR logic for each tap (e.g., polynomial coefficient) of the LFSR circuit. For example, as a data value is shifted and processed by two taps in a Galois LFSR, the data value is XOR'd with a first feedback value corresponding to a first coefficient at a first tap. Afterward, the result is then XOR'd with a second feedback value corresponding to a second coefficient at a second tap.

The arrangements shown in FIGS. 1-3 each implement multiple taps of an LFSR using only a single XOR operation. For instance, FIG. 1 shows a configuration 100 of the processing block 102 that implements a 2-tap segment of an LFSR. The configuration 100 in FIG. 1 achieves the same result as the 2-tap Galois example by XOR'ing a data value 120 with a combination 122 of the first and second feedback values that would be used in the Galois LFSR. The generation of such a combined feedback value is discussed in more detail with reference to below FIG. 4. A data value 120 is buffered in register 108, and a feedback value 122, corresponding to coefficients of the two implemented taps, is buffered in register 110. The buffered values are XOR'd by logic unit 114 and the result is stored in register 112. The length of the pipeline (e.g., 108, 114, and 112) ensures that results of the implemented 2-taps provide the correct number of shift registers in the LFSR and take the same number of shift-cycles as the Galois LFSR. As such, the 2-tap stage 100 may be used to replace two taps in an LFSR without affecting logical results.

As shown in FIGS. 2 and 3, a larger number of taps may be implemented by adding additional ones of the available registers (e.g., 104 and 106) to the pipeline of the 2-tap segment shown in FIG. 1. For instance, FIG. 2 shows a second configuration of the processing block 102 to implement a 3-tap stage 200 of an LFSR. In this example, the processing block 102 is configured to buffer and process data in a pipeline having registers 106, 108, and 112 and programmable XOR logic 114. Register 110 receives a feedback signal having the combined value of the feedback values that would be processed by the three taps in a Galois LFSR, and the combined value is XOR'd with a data value in register 108 in the pipeline by logic circuit 114.

Similarly, FIG. 3 shows a third configuration of the processing block 102 to implement a 4-tap stage 300 of an LFSR. In this example, the processing block 102 is configured to buffer and process data in a pipeline having registers 104, 106, 108, and 112 and programmable XOR logic 114. Register 110 receives a feedback signal that is equivalent to a combination of feedback values that would be processed by the four taps in a Galois LFSR. The feedback signal is XOR'd with a data value in register 108 in the pipeline.

Figure 4:
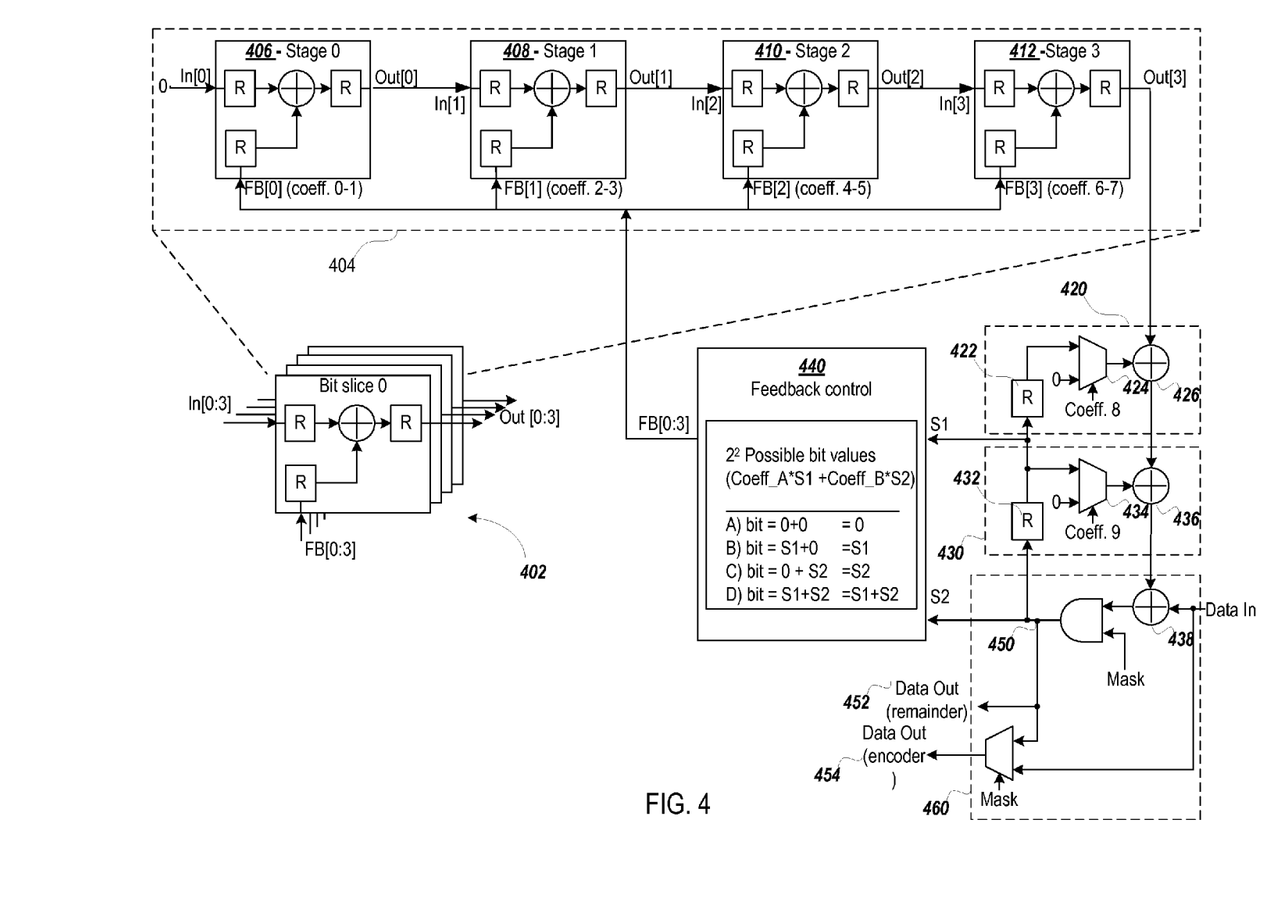
FIG. 4 shows a circuit diagram of an LFSR implemented using a plurality of 2-tap stages shown in FIG. 1.

FIG. 4 shows a circuit diagram of an LFSR implemented using a plurality of 2-tap stages. The group of 2-tap stages (e.g., 406, 408, 410, and 412) may be implemented by a single programmable multi-bit processing block. Each one of the 2-tap stages is implemented using a respective input bit to the multi-bit processing block. In this illustrated example, the 2-tap stages are implemented using a 4-bit processing block 402. For ease of reference, each bit of the multi-bit processing block may be referred to herein as a bit-slice. It will be appreciated that a multi-bit processing block may have more input bits available than are used to implement one LFSR. For example, if the processing block has 48-bit inputs and one LFSR uses 4 of the input bits, the remaining 44 bits may be used to implement other LFSRs.

The multi-tap processing stages implemented by the bit-slices are connected in series as shown in block 404 to implement 8 taps of an LFSR (i.e., 4 bit-slices*2 taps per bit-slice). For each processing stage (e.g., 406, 408, 410, and 412), a respective feedback signal (e.g., FB[0], FB[1], FB[2], or FB[3]) is generated by feedback control circuit 440. The feedback signal is generated from the output values of two consecutive cycles of the LFSR (which would normally be used for feedback by two different taps in a Galois LFSR).

The LFSR output values used for feedback may be buffered in a number of registers (e.g., 422 and 432). LFSR output values that are used for feedback are buffered by registers of a number of single-tap circuits (e.g., 420 and 430), which are arranged to implement the last two taps of the LFSR. In this example, the single-tap circuits are configured as taps would be configured in a Fibonacci LFSR, which buffers LFSR values to feedback to taps of the LFSR. In a Fibonacci LFSR arrangement, each single-tap circuit includes one register (e.g., 422 or 432) of the LFSR. Bit values of the register are filtered (e.g., by multiplexors 424 or 434) according to the respective coefficient of the polynomial implemented by the tap. The filters values are then XOR'd together and with an input value (e.g., by XOR circuits 426, 436, and 438) to provide an output 450 of the LFSR. In this example, input and output of the LFSR are controlled by an input/output circuit 460. The mask input (Mask) is used to control when the result should be shifted out. In this example, two data outputs are shown. The first output 454 may be used, e.g., for encoding, in which LFSR data is appended to the end of the data. The second data output 452 may be used, e.g., for syndrome generation, in which only the remainder of the division performed by the LFSR is output.

The feedback signals FB[0:3] are generated from the output values S1 and S2 by feedback control circuit 440 and as a function of the polynomial coefficients of the taps implemented by the corresponding stages of the LFSR. As described above, each tap performs an XOR operation with either a feedback data value or a logical zero, as indicated by a corresponding coefficient of the LFSR polynomial. The feedback control circuit applies the coefficients of each stage to the output values (e.g., S1 and S2) and XORs the result to produce a feedback signal (e.g., FB[1]) that is utilized by a corresponding stage (e.g., stage 1). The value of the feedback signal is given by $$FB[x] = \text{Coeff}\_A * S1 + \text{Coeff}\_B * S2,$$

where Coeff_A and Coeff_B are the polynomial coefficients of the taps implemented by the corresponding stage. In this example, there are 4 different possible combinations of Coeff_A and Coeff_B values (A through D) as shown in the table in feedback control 44. As such, four different feedback signal combinations (0, S1, S2, and S1+S2) may be used by the different multi-tap processing stages. If two or more of the stages utilize the same feedback signal combination, the generated signal combination may be used for both stages. In this manner, XOR logic used to generate the combined feedback signals may be reused, and hardware requirements may be reduced.

In some implementations, a multi-bit processing block may be configured to implement multiple LFSRs. For example, 12 instances of the LFSR shown in FIG. 4 could be implemented using a 48-bit processing block (48-bit slices and 4-bit slices per LFSR). As discussed with reference to FIGS. 2 and 3, a larger number of taps may be implemented by adding additional registers to the pipeline of the 2-tap processing stage shown in FIGS. 1 and 4.

Figure 5:
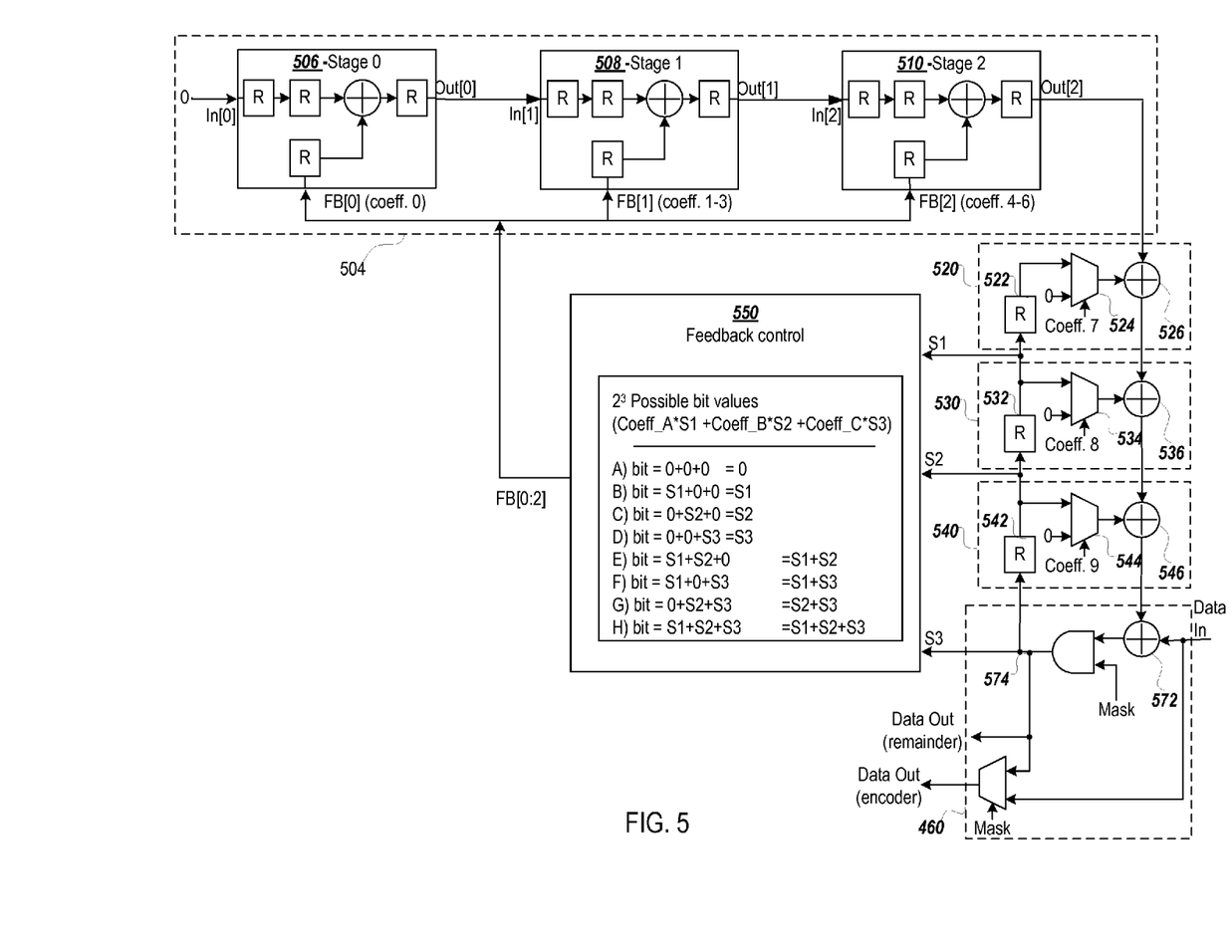
FIG. 5 shows a circuit diagram of an LFSR implemented using a plurality of 3-tap stages shown in FIG. 2.

For some applications, hardware efficiency may be increased by implementing a larger number of taps in each bit slice of a multi-bit processing block and reducing the number of bit slices that are required to implement the LFSR. For instance, FIG. 5 shows a circuit diagram of an LFSR implemented using a plurality of 3-tap processing stages. As discussed with reference to the LFSR of FIG. 4, the 3-tap processing stages (e.g., 506, 508, and 510) are implemented with respective bit-slices of a multi-bit processing block (not shown). In comparison to the example shown in FIG. 4, implementation of three taps in each bit slice reduces the number of bit slices needed for the LFSR from four to three.

The 3-tap processing stages implemented in the respective bit-slices are connected in series as shown in block 504 to implement 9 taps of an LFSR (i.e., 3 bit-slices*3 taps per bit-slice). For each 3-tap processing stage, a respective feedback signal (e.g., FB[0]) is generated by feedback control circuit 550. In this example, three output values (S1, S2, and S3), are used by feedback control circuit 550 to generate the respective feedback signals because each of the stages implements three taps of the LFSR. In this case, there are eight possible combinations of the feedback signals (0, S1, S2, S3, S1+S2, S1+S3, S2+S3, and S1+S2+S3) that may be used by the 3-tap stages.

The output values (S1, S2, and S3) are captured at inputs to feedback registers (522, 532, and 542) of three respective single-tap circuits (520, 530, and 540). In this example, each of the single-tap circuits is implemented using a Fibonacci-type single tap circuit. As described with reference to the Fibonacci-type single tap circuits 420 and 430 in FIG. 4, each single-tap circuit includes one register (e.g., 522, 532, or 542) of the LFSR. Bit values of the register are filtered (e.g., by multiplexors 524, 534, or 544) according to the respective coefficient of the polynomial implemented by the tap. The filters values are then XOR'd together and with an input value (Data In) (e.g., by XOR circuits 526, 536, 546, and 572) to provide an output 574 of the LFSR.

Input and output are controlled by an input/output circuit 460, which operates as described with reference to FIG. 4.

In general, for a processing stage configured to implement N taps of an LFSR, as discussed above, N sequential output signals (S1-SN) are captured and used to generate the corresponding feedback signal. In some particular implementations, N single-tap circuits are used to implement the last N taps of the LFSR and capture the N sequential output signals (S1-SN) used for feedback. This is similar to the implementations shown in FIGS. 4 and 5, in which N is equal to 2 and 3, respectively.

It is noted that the number of coefficients of the polynomial of the LFSR does not need to be the same as the number of taps provided by the multi-tap processing stages and the single-tap circuits of an LFSR. For instance, in the example shown in FIG. 5, the polynomial includes ten coefficients (Coeff. 0-9) whereas the LFSR circuit includes 12 taps. In this example, the single-tap circuits implement the last three coefficients (Coeff. 7-9) and processing stages 1 and 2 (508 and 510) implement the middle 6 coefficients (Coeff. 1-6). Only one coefficient is implemented by processing stage 0 (506). However, similar to the other processing stages, stage 0 is configured to implement up to three coefficients. To configure the 3-tap processing stage to implement less than three coefficients, the single coefficient (Coeff. 0) is padded with two zero coefficients to form a three coefficient set. The addition of the zero coefficients at the beginning of the first multi-tap stage 0 (506) will not influence the feedback signal that will be generated for stage 0 (506) or the operation thereof.

Figure 6:
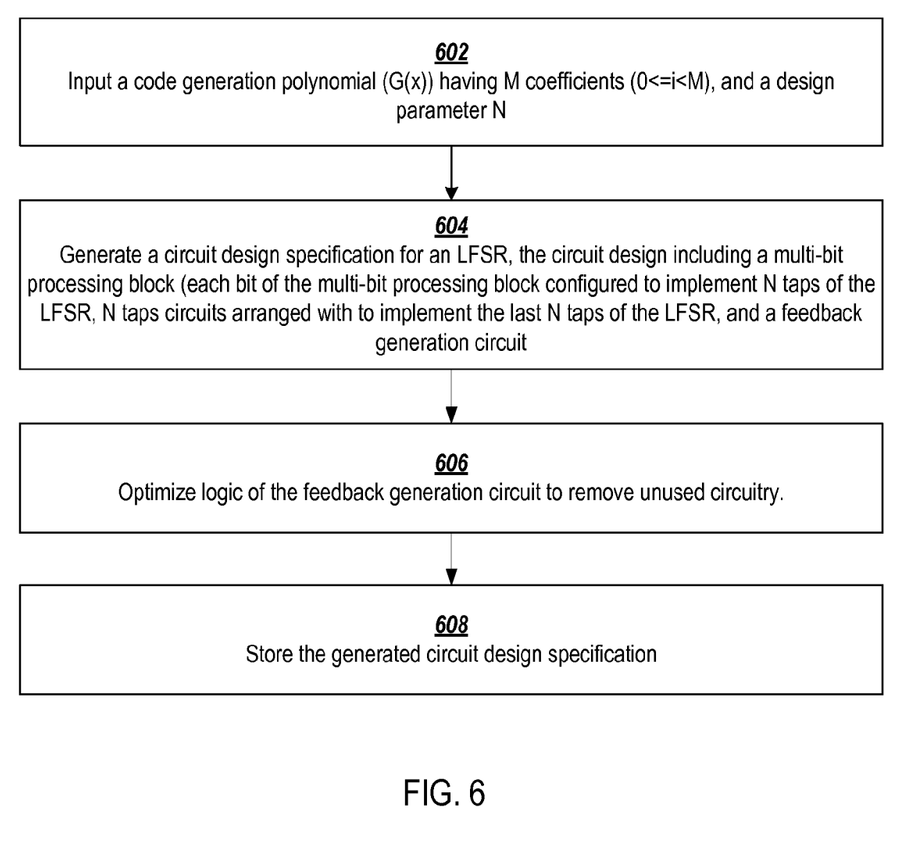
FIG. 6 shows an automated process for generation of an LFSR circuit design for an input code generation polynomial.

FIG. 6 shows an automated process for generation of an LFSR circuit design for a code generation polynomial. A code generation polynomial (G(x)) to be implemented by an LFSR circuit is input along with one or more design constraints at block 602. The design constraint number may indicate, for example, a number of taps to implement in each processing stage of the LFSR and/or a number of processing stages to include in the LFSR.

A circuit design specification for an LFSR is generated at block 604. As discussed with reference to FIGS. 4 and 5, the circuit design includes a multi-bit processing block (each bit of the multi-bit processing block being configured to implement a multi-tap processing stage having a respective set of N taps of the LFSR). The generated circuit design also includes, N single-tap circuits arranged to implement the last N taps of the LFSR, and a feedback controller configured to provide feedback signals for each respective set of taps of the LFSR.

In the ten coefficient polynomial examples shown in FIGS. 4 and 5, N single-tap circuits are used to implement the last N coefficients taps of the LFSR, and multi-tap processing stages are used to implement the first 10-N polynomial coefficients of the LFSR. However, the embodiments are not so limited. In some examples, the multi-tap processing stages implement some but not all of the first 10-N polynomial coefficients. For example, first 10-N polynomial coefficients of the LFSR may be implemented by a combination of multi-tap processing stages and Galois-like processing stages. If the Galois-like processing stages implement zero-coefficients then this simplifies to a set of register connected in series.

The logic of the feedback controller may be generated dynamically at block 604 based on the coefficients of the code generation polynomial (G(x)). Alternatively, an HDL specification of the feedback controller may be retrieved that includes logic to generate every possible combination of the output signals that may be used as feedback signals by the processing stages. In the latter implementation, logic of the retrieved feedback control circuit may be optimized at block 606 to remove portions of the logic used to generate combinations of the feedback signals, which are not used. Other optimizations may be performed as well to reduce hardware resources and/or increase performance. The generated circuit design specification is stored in a computer readable medium at block 608.

As indicated above, LFSRs may be utilized in a number of different applications. As one example, an LFSR may be used to facilitate forward error correction (FEC) coding and/or decoding. In design of communications systems, there is generally a compromise between bit error rate (BER) and transmission bit rate. Higher bit rates tend to have higher BERs. One method to reduce BER is forward error correction (FEC). FEC coding adds redundancy to a message by encoding such a message prior to transmission. Some example error correction codes include Hamming, Bose-Chaudhuri-Hochquenghem (BCH), Reed-Solomon (RS), Viterbi, trellis, etc. LFSRs may be used to facilitate encoding and decoding operations for a number of such FEC codes. As one example, BCH encoding and decoding may be implemented using LFSRs.

In BCH coding, code words for BCH rows or columns are expressed as a multiple of a generator polynomial, which in turn is a product of a number of minimal polynomials where the coefficients are in the binary finite field GF(2). An LFSR can be used to calculate a remainder after dividing by a polynomial which forms a key operation in BCH FEC CODECs. With particular reference to BCH coding performed in the G.975.1 I.7 Enhanced FEC Codec, a BCH encoder can be implemented using 32 LFSRs. Each of the 32 LFSRs is configured to divide a serial input stream by a 40-bit generator polynomial.

BCH Syndrome Generation is performed by evaluating the received polynomial at a particular value a' in a finite field used for decoding (in the case of G.975.1 I.7 rows this is $GF(2_{10})$). One approach performs BCH syndrome generation using an interleaver to convert the 32-bit incoming serial streams to TDM data for each row codeword, which was 36-bits wide. The syndromes are then calculated in parallel on the 36-bit words. However, each value of $\alpha^i$ has a minimal polynomial such that $m(\alpha^i)=0$. By using an LFSR to divide the incoming stream by $m(\alpha^i)$, syndromes can be calculated on a remainder polynomial that is only 10-bits long rather than 900-bits long.

Figure 7:
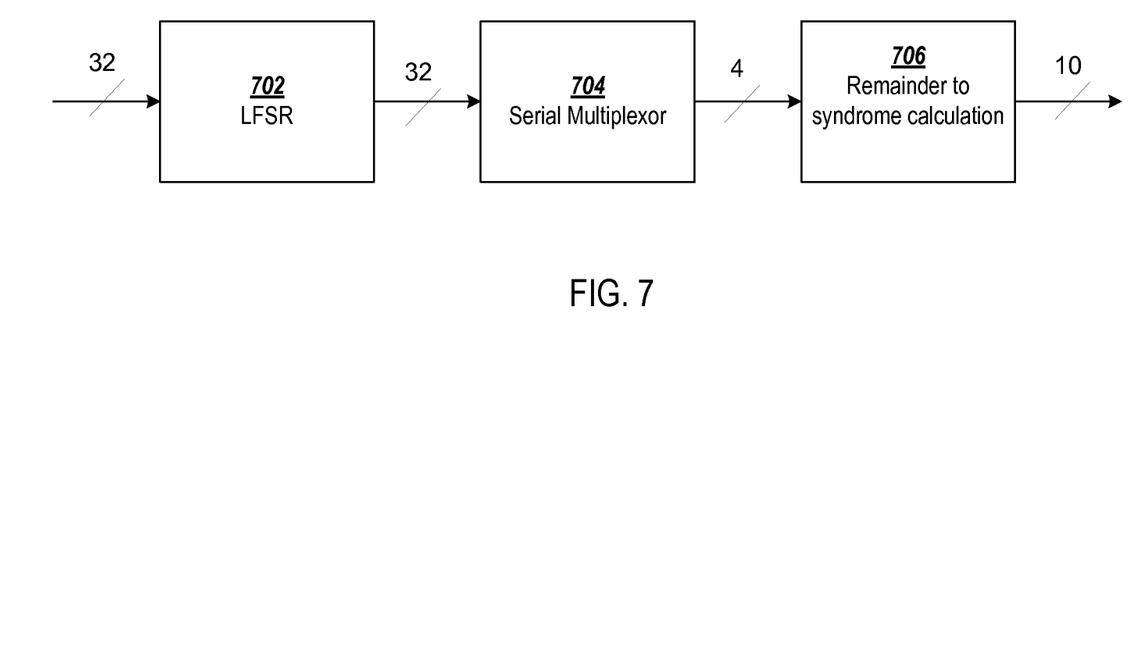
FIG. 7 shows a process for performing BCH syndrome generation using an LFSR.

FIG. 7 shows a process for performing BCH syndrome generation using an LFSR. LFSRs are used to divide row code words by a minimal polynomial of the odd syndromes at block 702. There are four minimal polynomials in the case of 7% overhead. This generates 128 remainders. These remainders are combined using a serial multiplexor process at block 704. For instance, the remainder from each row's LFSRs are OR'd with the delayed output from the previous rows. This creates a chain of shift registers and OR gates which creates a single serial stream for the remainder from each LFSR. The serial remainder streams are converted to syndromes at block 706 by evaluating at a'. Each syndrome, 10-bits wide for a row (8 in total) is output on subsequent cycles.

Table 1 shows approximate hardware resources required for the syndrome generation in FIG. 7 using a typical Galois LFSR and using an LFSR implemented with 3 tap stages (as shown in FIG. 5) using a 48 bit processing block (e.g., Xilinx DSP48). As shown therein, using the typical LFSR arrangement, syndrome generation in each decoder stage requires 2079 registers, 1249 look-up tables (LUTs), and 10 48-bit signal processors (e.g., Xilinx DSP48). In contrast, using an LFSR similar to that shown in FIG. 5, syndrome generation in each decoder stage requires 896 registers, 745 LUTs, and 11 DSP48s. G.975.1 I.7 includes 3 Row Decode stages, so the overall saving is 3549 Slice Registers and 1512 LUTs in the netlist compared to the typical Galois implementation. Since the interleaver circuit using the typical LFSRs used 30 DSP48s, only three additional DSP48s are required.

TABLE 1

|  | Registers | LUTs | DPS48s |
|---|---|---|---|
| Syndrome Generation w/ typical LFSR (Galois) | 2079 | 1249 | 10 |
| Syndrome Generation w/ new LFSR implementation | 896 | 745 | 11 |
| Difference | −1183 | −504 | +1 |

Figure 8:
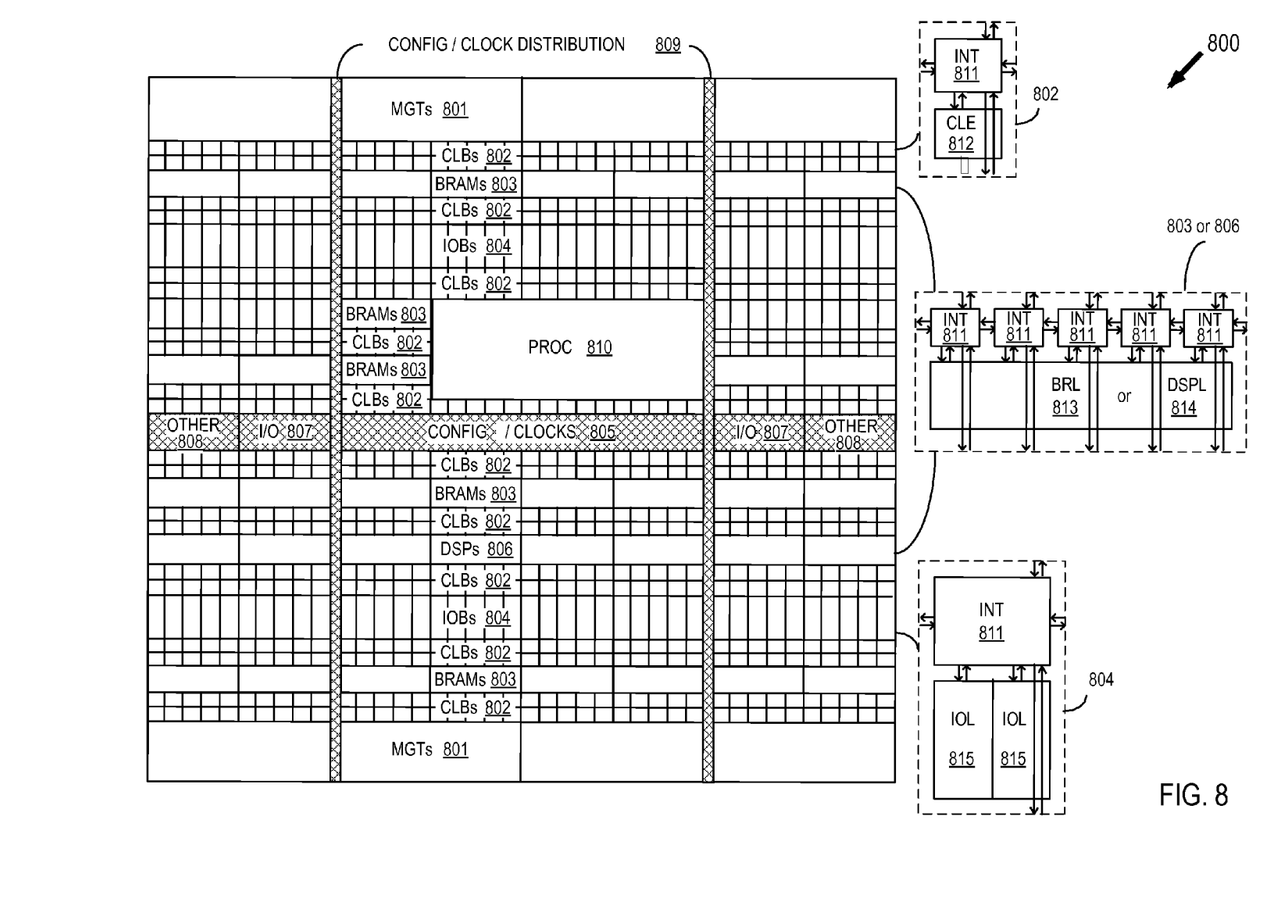
FIG. 8 shows a block diagram of an example programmable integrated circuit that may be used in implementing an LFSR.

FIG. 8 shows a block diagram of an example programmable IC that may be used in implementing an LFSR. An LSFR, as previously described, may be implemented on the programmable logic and interconnect resources of programmable integrated circuit. FPGAs can include several different types of programmable logic blocks in the array. For example, FIG. 8 illustrates an FPGA architecture (800) that includes a large number of different programmable tiles including multi-gigabit transceivers (MGTs 801), configurable logic blocks (CLBs 802), random access memory blocks (BRAMs 803), input/output blocks (IOBs 804), configuration and clocking logic (CONFIG/CLOCKS 805), digital signal processing blocks (DSPs 806), specialized input/output blocks (I/O 807), for example, e.g., clock ports, and other programmable logic 808 such as digital clock managers, analog-to-digital converters, system monitoring logic, and so forth. Some FPGAs also include dedicated processor blocks (PROC 810) and internal and external reconfiguration ports (not shown).

In some FPGAs, each programmable tile includes a programmable interconnect element (INT 811) having standardized connections to and from a corresponding interconnect element in each adjacent tile. Therefore, the programmable interconnect elements taken together implement the programmable interconnect structure for the illustrated FPGA. The programmable interconnect element INT 811 also includes the connections to and from the programmable logic element within the same tile, as shown by the examples included at the top of FIG. 8.

For example, a CLB 802 can include a configurable logic element CLE 812 that can be programmed to implement user logic plus a single programmable interconnect element INT 811. A BRAM 803 can include a BRAM logic element (BRL 813) in addition to one or more programmable interconnect elements. Typically, the number of interconnect elements included in a tile depends on the height of the tile. In the pictured FPGA, a BRAM tile has the same height as five CLBs, but other numbers (e.g., four) can also be used. A DSP tile 806 can include a DSP logic element (DSPL 814) in addition to an appropriate number of programmable interconnect elements. An IOB 804 can include, for example, two instances of an input/output logic element (IOL 815) in addition to one instance of the programmable interconnect element INT 811. As will be clear to those of skill in the art, the actual I/O pads connected, for example, to the I/O logic element 815 are manufactured using metal layered above the various illustrated logic blocks, and typically are not confined to the area of the input/output logic element 815.

In the pictured FPGA, a columnar area near the center of the die (shown shaded in FIG. 8) is used for configuration, clock, and other control logic. Horizontal areas 809 extending from this column are used to distribute the clocks and configuration signals across the breadth of the FPGA.

Some FPGAs utilizing the architecture illustrated in FIG. 8 include additional logic blocks that disrupt the regular columnar structure making up a large part of the FPGA. The additional logic blocks can be programmable blocks and/or dedicated logic. For example, the processor block PROC 810 shown in FIG. 8 spans several columns of CLBs and BRAMs.

Note that FIG. 8 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 8 are purely exemplary. For example, in an actual FPGA more than one adjacent column of CLBs is typically included wherever the CLBs appear, to facilitate the efficient implementation of user logic.

Figure 9:
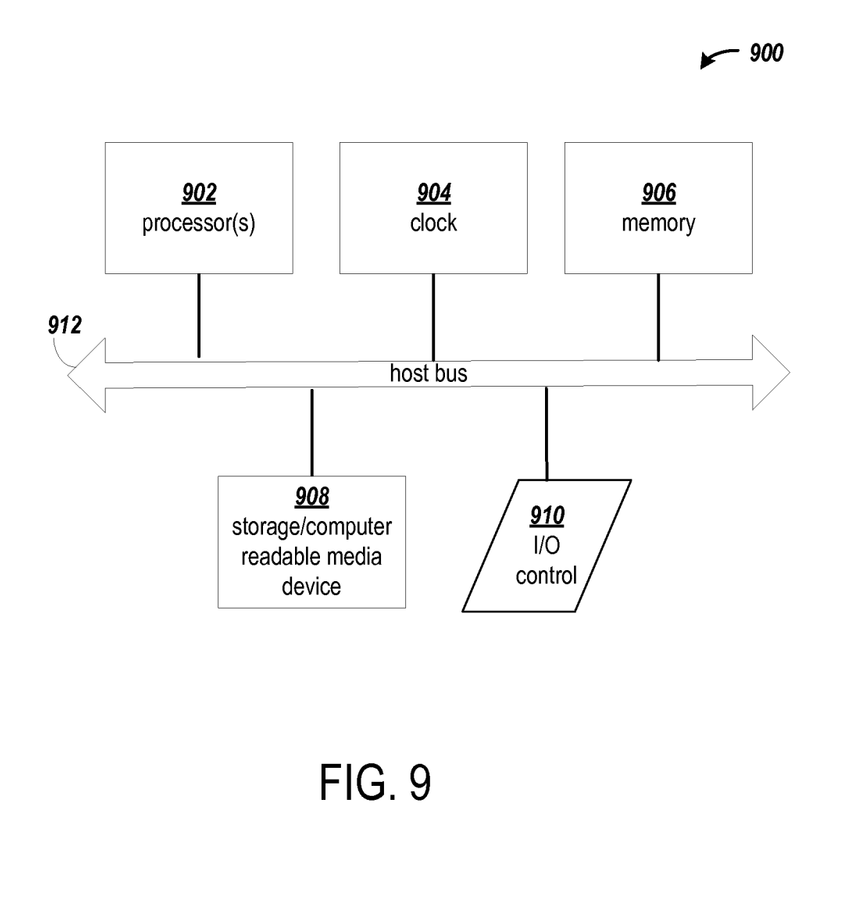
FIG. 9 shows a computing arrangement that may be configured to implement some of the processes and functions described herein.

FIG. 9 shows a computing arrangement that may be configured to implement some of the processes and functions described herein. It will be appreciated that various alternative computing arrangements, including one or more processors and a memory arrangement configured with program code, would be suitable for hosting the disclosed processes and data structures. The computer code, which implements the disclosed processes, is encoded in a processor executable format and may be stored and provided via a variety of computer-readable storage media or delivery channels such as magnetic or optical disks or tapes, electronic storage devices, or as application services over a network.

Processor computing arrangement 900 includes one or more processors 902, a clock signal generator 904, a memory unit 906, a storage unit 908, and an input/output control unit 910, all coupled to a host bus 912. The arrangement 900 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor 902 may be one or more general purpose processors, or a combination of one or more general purpose processors and suitable co-processors, or one or more specialized processors (e.g., RISC, CISC, pipelined, etc.).

The memory arrangement 906 typically includes multiple levels of cache memory, and a main memory. The storage arrangement 908 may include local and/or remote persistent storage, such as provided by magnetic disks (not shown), flash, EPROM, or other non-volatile data storage. The storage unit may be read or read/write capable. Further, the memory 906 and storage 908 may be combined in a single arrangement.

The processor arrangement 902 executes the software in storage 908 and/or memory 906, reads data from and stores data to the storage 908 and/or memory 906, and communicates with external devices through the input/output control arrangement 910. These functions are synchronized by the clock signal generator 904. The resource of the computing arrangement may be managed by either an operating system (not shown), or a hardware control unit (not shown).

The embodiments are thought to be applicable to a variety of applications and circuits using LFSRs. Other aspects and embodiments will be apparent to those skilled in the art from consideration of the specification. The embodiments may be implemented as one or more processors configured to execute software, as an application specific integrated circuit (ASIC), or as a logic on a programmable logic device. It is intended that the specification and illustrated embodiments be considered as examples only, with a true scope of the invention being indicated by the following claims.

What is claimed is:

1. A shift register, comprising:
    a plurality of M processing stages coupled in series, each processing stage configured to implement N taps of the shift register, wherein N>1, each coefficient of a feedback polynomial implemented by the shift register corresponding to respective one of the taps of the shift register;
    N single tap circuits coupled in series, a first of the N single tap circuits in the series coupled to an output of a last of the series of processing stages, and the N single tap circuits configured to implement the last N taps of the shift register; and
    a feedback control circuit configured to provide for one or more of the plurality of M processing stages, a respective 1-bit feedback signal as a function of polynomial coefficients implemented by the processing stage and data values input to one or more of the N single tap circuits.

2. The shift register of claim 1, wherein:
    the feedback polynomial of the shift register includes L coefficients;
    the N single tap circuits implement the last N of the L coefficients; and
    the plurality of M processing stages implement the first L-N of the L coefficients.

3. The shift register of claim 1, wherein
    the plurality of M processing stages are configured to implement N*M-E of the coefficients of the feedback polynomial of the shift register; and
    the N taps implemented by a first one of the processing stages in the series are configured to implement E zero coefficients not included in the feedback polynomial and N-E of the coefficients of the feedback polynomial.

4. The shift register of claim 1, wherein for each of one or more of the plurality of processing stages, the N taps are configured to implement less than N coefficients of the feedback polynomial.

5. The shift register of claim 1, wherein:
    the feedback polynomial of the shift register includes L coefficients;
    the N single tap circuits implement the last N of the L coefficients;
    the plurality of M processing stages implement one or more of the first L-N of the L coefficients; and
    at least one zero coefficient of the first L-N of the L coefficients are implemented by a register connected in series with the plurality of M processing stages.

6. The shift register of claim 1, wherein:
    for each processing stage implementing only zero coefficients of the feedback polynomial, the respective feedback signal provided by the feedback control circuit is equal to a value of a logical '0';
    for each processing stage implementing only one non-zero coefficient of the feedback polynomial, the respective feedback signal provided by the feedback control circuit is equal to a value output from one of the N single tap circuits that corresponds to the non-zero coefficient implemented by the processing stage; and
    for each processing stage implementing a plurality of non-zero coefficients of the feedback polynomial, the respective feedback signal provided by the feedback control circuit is equal to an XOR of values output from the N single tap circuits that correspond to the non-zero coefficients implemented by the processing stage.

7. The shift register of claim 1, wherein the plurality of M processing stages are implemented within a multi-bit processing block, and each of the plurality of processing stages is implemented using a respective bit slice of the multi-bit processing block.

8. The shift register of claim 7, wherein the multi-bit processing block is configured to:
receive and buffer multi-bit values in a pipeline; and
sequentially process each of the received multi-bit values by:
XORing the multi-bit value with a respective multi-bit feedback value generated from the feedback control circuit, each bit of the multi-bit feedback value corresponding to one of the respective feedback signals; and
storing the result of the XOR operation in an output register.

9. The shift register of claim 8, wherein, the multi-bit processing block is configured to, in response to XORing the multi-bit value with the respective multi-bit feedback value generated from the feedback control circuit, receive a new multi-bit feedback value from the feedback control circuit.

10. The shift register of claim 8, wherein the XORing of the multi-bit value with the respective multi-bit feedback value generated from the feedback control circuit is logically equivalent to the process performed by N respective taps of a Galois LFSR arrangement.

11. The shift register of claim 1, wherein the N single tap circuits are arranged in a Fibonacci arrangement.

12. The shift register of claim 7, further including:
a second plurality of processing stages connected in series, each configured to implement N taps of a second shift register, each of the second plurality of processing stages implemented using a respective bit of the multi-bit processing block.

13. A forward error correction (FEC) circuit, comprising:
a linear feedback shift register (LFSR) configured to divide a sequence of symbols by a minimum polynomial to determine a set of remainders from the sequence of symbols; the LFSR including:
a plurality of processing stages coupled in series, each processing stage configured to implement N taps of the LFSR, wherein N>1, each of the N taps corresponding to a respective coefficient of a feedback polynomial of the LFSR;
N single tap circuits coupled in series, a first of the N single tap circuits in the series coupled to an output of a last of the series of processing stages, and the N single tap circuits configured to implement the last N taps of the LFSR; and
a feedback control circuit configured to provide for one or more of the plurality of processing stages, a respective 1-bit feedback signal as a function of polynomial coefficients implemented by the processing stage and output from one or more of the N single tap circuits; and
a syndrome calculation circuit configured to calculate a syndrome for each of the determined set of remainders.

14. The FEC circuit of claim 13, wherein:
for each processing stage implementing only zero coefficients of the feedback polynomial, the respective feedback signal provided by the feedback control circuit is equal to a value of a logical '0';
for each processing stage implementing only one non-zero coefficient of the feedback polynomial, the respective feedback signal provided by the feedback control circuit is equal to a value output from one of the N single tap circuits that corresponds to the non-zero coefficient implemented by the processing stage; and
for each processing stage implementing a plurality of non-zero coefficients of the feedback polynomial, the respective feedback signal provided by the feedback control circuit is equal to an XOR of values output from the N single tap circuits that correspond to the non-zero coefficients implemented by the processing stage.

15. The FEC circuit of claim 13, wherein:
the processing stages of the plurality of processing stages are implemented within a multi-bit processing block;
each of the plurality of processing stages is implemented using a respective bit slice of the multi-bit processing block; and
the multi-bit processing block is configured to:
receive and buffer multi-bit values in a pipeline; and
sequentially process each of the received N multi-bit values by:
XORing the multi-bit value with a respective multi-bit feedback value generated from the feedback control circuit, each bit of the multi-bit feedback value corresponding to one of the respective feedback signals; and
storing the result of the XOR operation in an output register.

16. The FEC circuit of claim 13, wherein the N single tap circuits are arranged in a Fibonacci arrangement.

17. A method of generating a circuit design comprising:
inputting a code generation polynomial (G(x)) having L coefficients ($0 \leq i < L$);
inputting a design parameter N;
using a processor, generating, in response to the input code generation, an HDL circuit design specification of an LFSR for the code generation polynomial, the LFSR including:
a plurality of processing stages coupled in series, each processing stage configured to implement N taps of the LFSR, the first L-N of the coefficients of the polynomial G(x) corresponding to respective ones of the taps implemented by the plurality of processing stages;
N single tap circuits coupled in series, a first of the N single tap circuits in the series coupled to an output of a last of the series of processing stages, each of the last N of the coefficients of the polynomial G(x) corresponding to a respective one of the N single tap circuits; and
a feedback control circuit configured to provide for one or more of the plurality of processing stages, a respective 1-bit feedback signal as a function of the coefficients implemented by the processing stage and N values input to the N single tap circuits; and
storing the generated HDL circuit design specification in a computer readable medium.

18. The method of claim 17, wherein:
the plurality of processing stages are configured to implement a Galois type LFSR segment of length L-N; and
the N single tap circuits are configured to implement a Fibonacci type LFSR segment of length N.

19. The method of claim 17, wherein the generation of the LFSR includes:
determining combinations of the N values input to the N single tap circuits that are used by one or more or the respective feedback signals; and
generating a circuit design specification of a logic circuit configured to produce each of the determined combinations of the N values.

20. The method of claim 17, wherein the generation of the LFSR includes:
 retrieving a circuit design specification of a logic circuit configured to provide each possible combination of the N values input to the N single tap circuits;
 determining which of the possible combinations correspond to the respective feedback signals; and
 optimizing the retrieved circuit design specification of the logic circuit to produce a circuit design specification of the feedback control circuit, the optimization including identifying and removing circuitry of the logic circuit that is not used to provide the possible combinations corresponding to the respective feedback signals.

* * * * *